(12) United States Patent
Liu et al.

(10) Patent No.: US 7,768,123 B2
(45) Date of Patent: Aug. 3, 2010

(54) STACKED DUAL-DIE PACKAGES, METHODS OF MAKING, AND SYSTEMS INCORPORATING SAID PACKAGES

(75) Inventors: Yong Liu, Scarborough, ME (US); Howard Allen, Limington, ME (US); Qiuxiao Qian, Jiangsu (CN); Jianhong Ju, Gorham, ME (US)

(73) Assignee: Fairchild Semiconductor Corporation, South Portland, ME (US)

( * ) Notice: Subject to any disclaimer, the term of this patent is extended or adjusted under 35 U.S.C. 154(b) by 238 days.

(21) Appl. No.: 11/861,967

(22) Filed: Sep. 26, 2007

(65) Prior Publication Data
US 2009/0079092 A1 Mar. 26, 2009

(51) Int. Cl.
*H01L 23/34* (2006.01)
(52) U.S. Cl. .................. 257/723; 438/107
(58) Field of Classification Search ........... 257/723, 257/724, 725, 777, 778; 438/107, 108, 109
See application file for complete search history.

(56) References Cited

U.S. PATENT DOCUMENTS

| | | | |
|---|---|---|---|
| 6,777,786 B2 | 8/2004 | Estacio | |
| 7,029,947 B2 | 4/2006 | Joshi | |
| 7,061,077 B2 * | 6/2006 | Joshi | 257/666 |
| 7,211,466 B2 | 5/2007 | Lo et al. | |
| 7,224,070 B2 | 5/2007 | Yang | |
| 7,485,971 B2 * | 2/2009 | Fuller et al. | 257/780 |
| 2002/0180025 A1 | 12/2002 | Miyata et al. | |
| 2006/0121645 A1 | 6/2006 | Ball | |
| 2007/0099341 A1 | 5/2007 | Lo | |

FOREIGN PATENT DOCUMENTS

JP 2002-222914 A 8/2002

OTHER PUBLICATIONS

Fairchild Semiconductor Data Sheet-FPF2123-FPF2125, IntelliMAX Advanced Load Management Products, Sep. 2006, Fairchild Semiconductor Corporation, Rev. C4 1-13.
Fairchild Semiconductor Data Sheet-FSA201-USB2.0 Full-Speed and Audio Switches with Negative Signal Capability, Apr. 2007, Fairchild Semiconductor Corporation, Rev. 1.2.1, 1-21.
Fairchild Semiconductor Data Sheet-FSA221-USB2.0 High-Speed (480Mbps) and Audio Switches with Negative Signal Capability, Apr. 2007, Fairchild Semiconductor Corporation , Rev. 1.0.6, 17-18.

* cited by examiner

*Primary Examiner*—Mark Prenty
(74) *Attorney, Agent, or Firm*—Townsend and Townsend and Crew LLP (57) ABSTRACT

A semiconductor die package. It includes a substrate having a first surface and a second surface, a first semiconductor die having its front surface facing the first surface of the substrate, a conductive adhesive disposed between the first semiconductor die and the first surface of the substrate, and a second semiconductor die located on the first semiconductor die. The front surface of second semiconductor die faces away from the first semiconductor die, and the back surface faces toward the first semiconductor die. A plurality of conductive structures electrically couple regions at the front surface of the second semiconductor die to conductive regions at the first surface of the substrate.

28 Claims, 6 Drawing Sheets

STACKED DUAL-DIE PACKAGES, METHODS OF MAKING, AND SYSTEMS INCORPORATING SAID PACKAGES

CROSS-REFERENCES TO RELATED APPLICATIONS

NOT APPLICABLE

BACKGROUND OF THE INVENTION

Small semiconductor die packages are increasingly being used in portable electronic devices such as wireless phones, MP3 players, wireless headsets, and the like. As general trends, such devices are becoming smaller in size, while increasing in functionality. These trends are generally conflicting since increases in functionality generally require increases in component count and component wiring. It would be desirable to provide ways to mitigate these conflicting trends so that both can continue without compromise.

BRIEF SUMMARY OF THE INVENTION

As part of making their invention, the inventors have recognized that device designers often use a combination of signal-processing circuitry and power-control circuitry to implement new functionalities in portable electronic devices, where the signal-processing circuitry may be analog circuitry, digital circuitry, or a combination thereof. The processing and power-control circuitries are often segregated onto separate semiconductor die, or could be segregated. The inventors have also recognized that device designers often use a combination of analog circuitry and digital circuitry to implement new functionalities in portable electronic devices, where the analog and digital circuitries are often segregated onto separate semiconductor dice. It has been discovered that the above combinations of circuitries could be realized in smaller spaces if a single semiconductor die package could be used to interconnect a combination of circuitries without increasing the physical size of the package.

Accordingly, a first general embodiment of the invention is directed to a semiconductor die package comprising: a substrate having a first surface and a second surface, a first semiconductor die, a conductive adhesive disposed between the first semiconductor die and the first surface of the substrate, and a second semiconductor die located on the first semiconductor die. The second semiconductor die comprises a first surface facing away from the first semiconductor die and a second surface facing toward the first semiconductor die. The semiconductor die further comprises a plurality of conductive structures that electrically couple regions at the first surface of the second semiconductor die to conductive regions at the first surface of the substrate.

This general embodiment of the invention enables a device designer to stack two semiconductor dice of device in a single package with the back surfaces (e.g., inactive surfaces) of the dice facing one another. The designer may then make electrical connections to the front surface (e.g., active surface) of the first die with patterns in the conductive adhesive between the first die and the substrate, such as by using flip-chip bonding. Electrical connections to the front surface (e.g., active surface) of second die may be made with the aforementioned conductive structures. Electrical interconnections between dice may be made with a combination of electrical traces in the substrate and the conductive structures. In further embodiments to this embodiment, one or more thermally-conductive vertical paths (e.g., "thermal vias") may be incorporated into the substrate and thermally coupled to one or more thermal pads on the first die to increase heat removal from the package. The die generating the greater amount of heat may be selected as the first die in this further embodiment. In yet further embodiments, a ground plane may be incorporated into the substrate, and optionally coupled to a ground plane on the first die, to provide electrical shielding for the first die. In yet further embodiments, a thermally-conductive vertical path and a ground plane may be provided together as a single structure.

Another general embodiment of the invention is directed to a method for forming a semiconductor die package, the method comprising: attaching a first semiconductor die and a substrate together using a conductive adhesive, attaching the first semiconductor die and a second semiconductor die together using an adhesive, wherein the second semiconductor die has a first surface facing away from the first semiconductor die and a second surface facing toward the first semiconductor die, and attaching a plurality of conductive structures to the first surface of the second semiconductor die and the substrate. The first and second semiconductor dice may be attached together before or after the first semiconductor die and the substrate are attached together. Also, the first and second semiconductor dice may be attached together substantially simultaneously with the first semiconductor die and the substrate being attached together.

Another general embodiment of the invention is directed to a system, such as a portable electronic device that comprises a semiconductor die package according to the invention. An implementation of such a system may include a universal-serial-bus controller that is electrically coupled to one or more die of the package.

These and other embodiments of the invention are described in detail in the Detailed Description with reference to the Figures. In the Figures, like numerals may reference like elements and descriptions of some elements may not be repeated.

BRIEF DESCRIPTION OF THE DRAWINGS

FIGS. 1-3 show a perspective top view, a side view, and a bottom view, respectively, of an exemplary semiconductor die package according to the invention.

DETAILED DESCRIPTION

Figure 1:
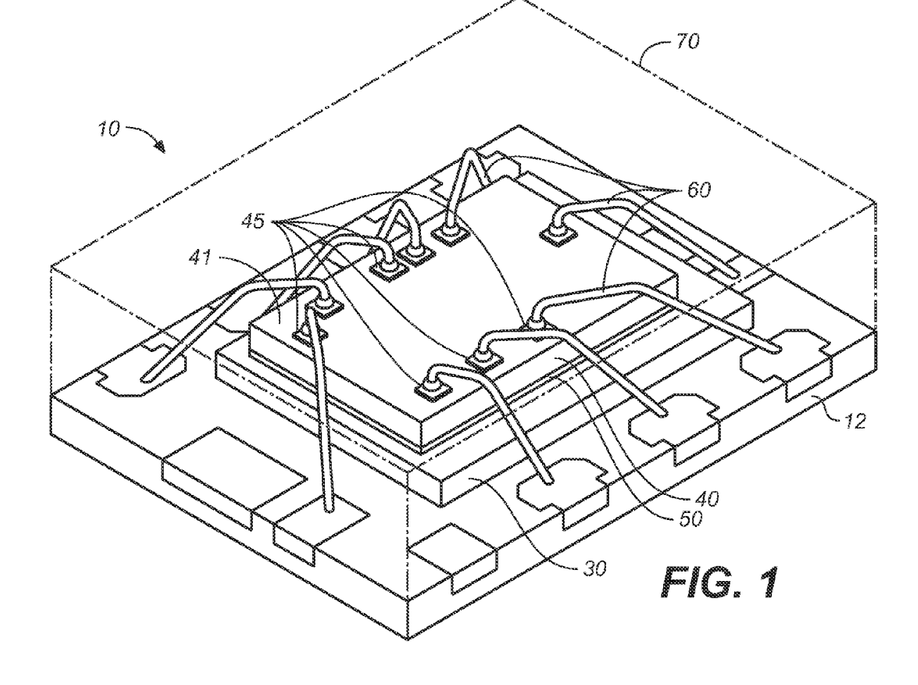
Figure 2:
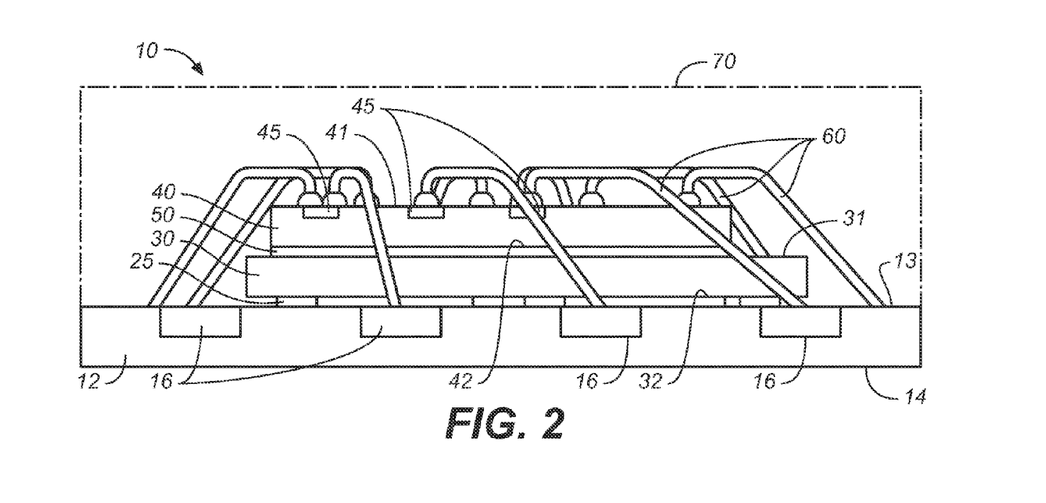

A first exemplary embodiment of the invention is directed to a semiconductor die package shown at 10 in FIGS. 1 and 2. Package 10 comprises a substrate 12, a first semiconductor die 30, an electrically-conductive adhesive 25 (shown in FIG.

2) disposed between first semiconductor die 30 and substrate 12, and a second semiconductor die 40 disposed on first semiconductor die 30, and adhered therewith by an adhesive 50. The front surface of first semiconductor die 30 preferably faces substrate 12, whereas the front surface of second semiconductor die 40 preferably faces away from both substrate 12 and first semiconductor die 30. The back surfaces of dice 30 and 40 preferably face one another, and are bonded together by adhesive 50. As used herein, the "front surface" of a die is the surface which has the most number of conductive regions (e.g., interconnect pads, or "lands"), and the "back surface" is the surface which has the least number. Typically, the back surface has no contacts, or only a ground contact, or only one or a few drain or collector contacts (in the case of a vertical transistor die). As is known in the art, the "active surface" of a semiconductor die is the surface that has the most electrical components, whereas the "inactive surface" is the surface which has the least (the definition of electrical component includes such things as transistor, resistors, capacitors, inductors, wires, etc.). Typically, but not always, the active surface of a die will also be the front surface, and the inactive surface will be the back surface.

The dice in the semiconductor die packages according to embodiments of the invention may also include power transistors or other types of devices which have at least one input terminal at one surface and an output terminal at the opposite surface. Such devices may be characterized as being "vertical" devices. Examples of some vertical devices include vertical power MOSFETs, vertical diodes, etc.

Figure 3:
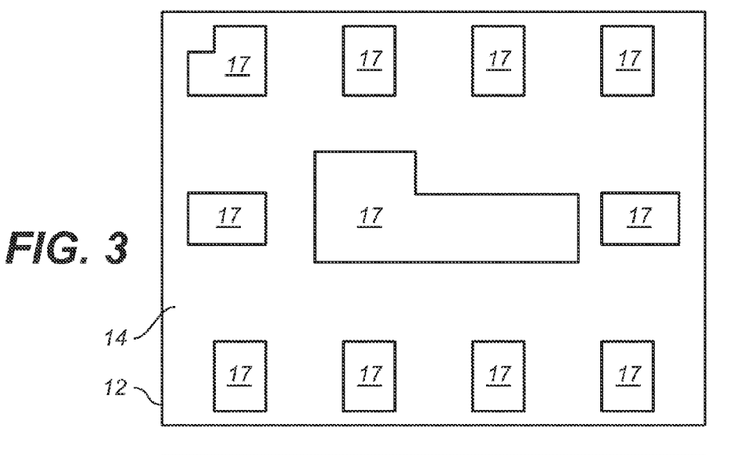
FIG. 3 also shows a plane view of the bottom surface of an exemplary substrate that may be used in exemplary semiconductor packages according to the invention.
Figure 4:
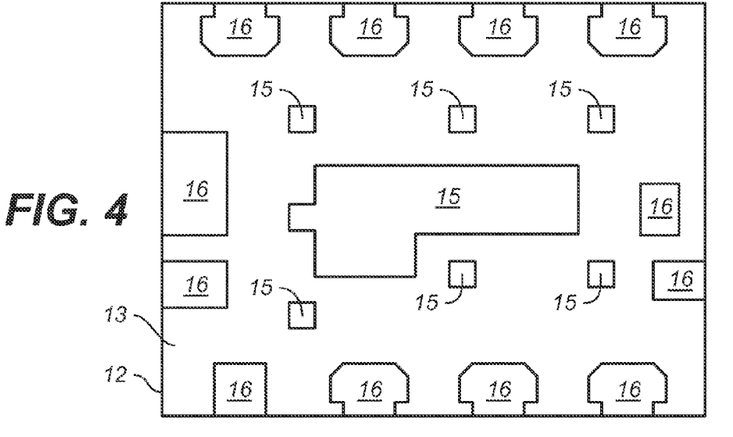
FIG. 4 shows a plane view of the top surface of an exemplary substrate that may be used in exemplary semiconductor packages according to the invention.

Stated more generally, and referring to FIGS. 3 and 4, substrate 12 has a first surface 13 (FIG. 4), a second surface 14 (FIG. 3), a plurality of first conductive regions 15 disposed on its first surface 13 and adapted to couple to conductive regions on first semiconductor die 30, a plurality of second conductive regions 16 disposed on its first surface 13, and a plurality of third conductive regions 17 disposed on its second surface 14. Referring back to FIG. 2, first semiconductor die 30 has a first surface 31 (e.g., back surface) facing away from substrate 12, and a second surface 32 (e.g., front surface) facing toward first surface 13 of substrate 12. First semiconductor die 30 has a plurality of conductive regions that are adhered to first conductive regions 15 of substrate 12 (shown in FIG. 4) by conductive adhesive 25, which can comprise solder. Second semiconductor die 40 has a first surface 41 (e.g., front surface) facing away from first semiconductor die 30, and a second surface 42 (e.g., back surface) facing toward first semiconductor die 30, which is adhered to first surface 31 of die 30 by adhesive 50. Adhesive 50 preferably comprises an electrically-insulating adhesive material, such as an epoxy adhesive.

Referring to FIGS. 1 and 2, semiconductor die package 10 further comprises a plurality of conductive structures 60 that electrically couple a plurality of conductive regions 45 at first surface 41 of second semiconductor die 40 to a plurality of second conductive regions 16 of substrate 12. Conductive regions 45 may comprise conventional IC pads, and conductive structures 60 may comprise wire bonds, ribbon bonds, tape-automated bonds ("TAB bonds"), conductive clips, and the like. Conductive structures 60, along with wiring in substrate 12 (described below), provide electrical interconnections between semiconductor dice 30 and 40, and between semiconductor die 40 and systems that utilize package 10. Preferably, semiconductor die package 10 further comprises a body 70 of electrically-insulating material disposed on and over conductive structures 60 and the exposed first surfaces of substrate 12 and semiconductor dice 30 and 40, and preferably encapsulating conductive structures 60. Body 70 provides mechanical support to conductive structures 60, prevents them from being bent or torn off by external forces, and, along with substrate 12, provides a rugged shell for semiconductor die package 10. Package 10 has a leadless configuration, which means that there are no conductive leads extending substantially beyond the dimensions of the package. Electrical connections to package 10 are made at the conductive regions 17 at second surface 14 of substrate 12.

Substrate 12 can comprise a pre-molded leadframe, a laminate, or any other type of substrate structure with electrical interconnects. An exemplary premolded leadframe can comprise a leadframe embedded in a molding material, wherein the molding material has a thickness that is substantially equal to a thickness of the lead frame structure. In some embodiments, the premolded substrate may comprise a first surface and/or an opposite second surface, which may include a lead surface and/or a die attach surface, as well as an exterior molding material surface which is coplanar with the lead surface and/or the die attach surface.

Figure 5:
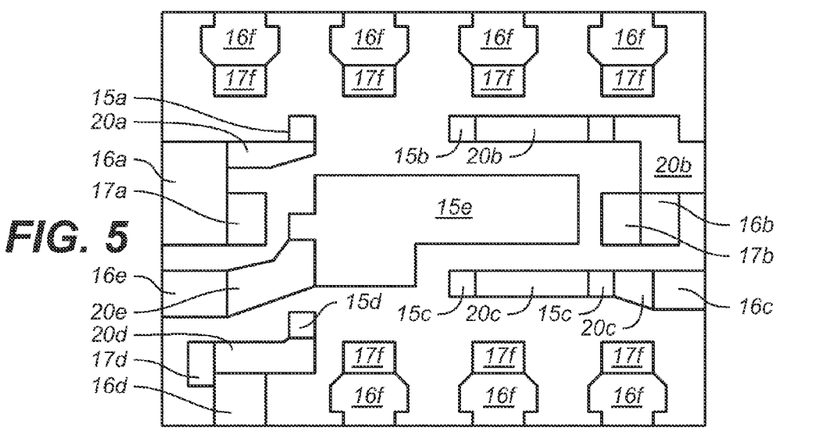
FIG. 5 shows a top plane view of the electrical traces and connection pads of the exemplary substrate shown in FIG. 4.
Figure 6:
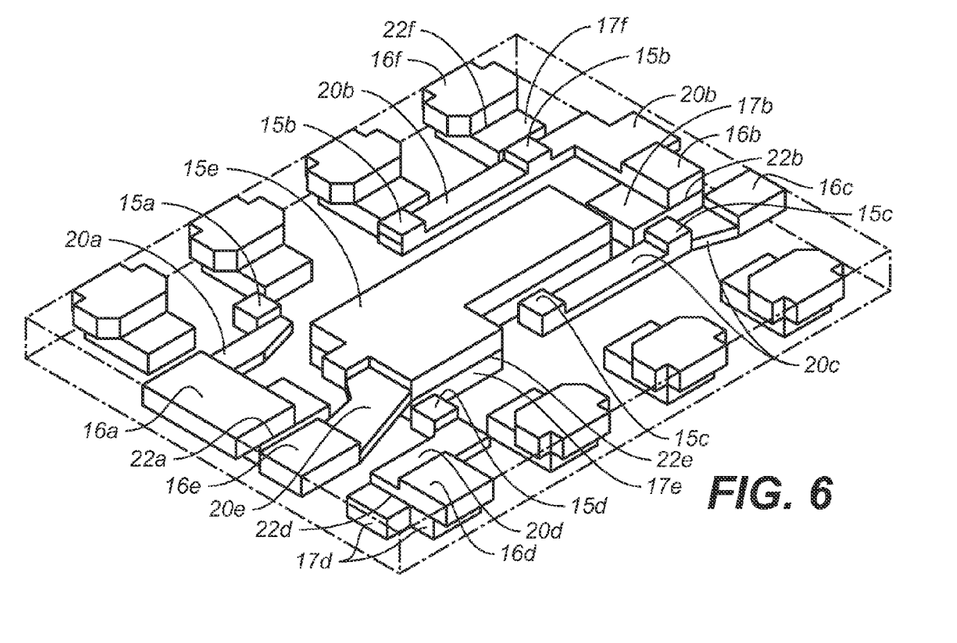
FIG. 6 shows a translucent perspective view of the electrical traces and connection pads of the exemplary substrate shown in FIGS. 4 and 5.

In addition to conductive regions 15-17 described above, substrate 12 preferably comprises a plurality of traces 20 and vertical conductors 22, which provide a plurality of interconnections between and among various ones of conductive regions 15, 16, and 17. As used herein, the term "vertical conductor" broadly covers any electrical connection that spans between two surfaces of a substrate or die. In laminated substrate technologies, a vertical conductor may be implemented by a via. The term "trace" broadly covers any segment of conductive material that has an electrical function other than that of a vertical conductor or an interconnect pad. Typically, but not always, a trace electrically connects two or more of the following items: vertical conductors, interconnect pads (i.e., conductive regions), and other traces. FIGS. 5 and 6 illustrate traces 20 and vertical conductors 22 in an example where substrate 12 comprises a pre-molded leadframe. FIG. 5 shows a top plane view, and FIG. 6 shows a top translucent perspective view, where the non-conductive molding material of the leadframe has not been shown in the figure so that traces 20 and vertical conductors 22 may be more clearly seen. In this example, a vertical conductor 22 can be formed by abutting a selected region 16 to a selected region 17, and a trace may be formed by providing a inner segment of metal in a leadframe, with one or more portions of the segment contacting selected ones of regions 15-17. A first trace 20a electrically couples a first region 15a to a second region 16a, and second region 16a and a third region 17a abut one another to form a vertical conductor 22a between them. Along with a conductive structure 60, these components can provide an electrical interconnection among dice 30 and 40 and a system utilizing package 10. A second trace 20b electrically couples two first regions 15b and a second region 16b together, and second region 16b and a third region 17b abut one another to form a vertical conductor 22b between them. These components, along with a conductive structure 60, can also provide an electrical interconnection among dice 30 and 40 and a system utilizing package 10.

A third trace 20c electrically couples two first regions 15c, and a second region 16c together. Along with a conductive structure 60, these components can provide an electrical interconnection between dice 30 and 40. A fourth trace 20d electrically couples a first region 15d, a second region 16d, and a third region 17d together, with a vertical conductor 22d formed between regions 16d and 17d. A fifth trace 20e electrically couples a first region 15e and a second region 16e together, and first region 15e and a third region 17e abut one another to form a vertical conductor 22e between them. In combination with conductive structures 60, these last two sets of components provide electrical interconnections among dice 30 and 40 and a system utilizing package 10. Finally, a plurality of vertical conductors 22f are formed by respective pairs of regions 16f and 17f abutting one another (for visual clarity, reference numbers for only one of vertical conductors 22f are show in FIG. 6). Vertical conductors 22f, in combination with respective conductive structures 60, provide electrical interconnections between die 40 and a system that utilizes package 10. As an additional feature, the large relative areas of regions 15e and 17e (relative to 16f and 17f) and vertical conductor 22e, and their position under die 30, provide a large thermally-conductive vertical path through the surfaces of substrate 12 (e.g., a thermal via) that can conduct heat from dice 30 and 40 to a system that utilizes package 10. Each of regions 15-17 typically comprises one or more metals, each of which generally has a higher thermal conductivity than that of the material of body 70, and that of the insulating material of substrate 12. As an additional feature, regions 15e and 17e may be used as a ground plane for die 30.

As such, a designer can use traces 20, vertical conductors 22, conductive regions 15-17, and conductive structures 60 to provide a desired set of electrical interconnects between dice 30 and 40, and between each of dice 30 and 40 and a system that uses semiconductor die package 10. These interconnections and dice 30 and 40 can be provided together in a space of a single ordinary semiconductor die package, thereby enabling device designers to increase the functionality of their devices without increasing the size, and in some case decreasing the size. The leadframe or laminate for substrate 12 can be readily designed and mass produced with a configuration of traces and vertical conductors that, in combination with conductive structures 60, provide the interconnects for a desired application. Also, the arrangement and sizes of conductive regions 17 on surface 14 of substrate 12 may conform to a standard pattern, such as found in the MicroPak 10 package of Fairchild Semiconductor, to facilitate the incorporation of packages 10 into existing design and manufacturing flows. In further embodiments, redundant traces, vertical conductors, and conductive regions may be included in substrate 12 to enable easy implementations of design changes, and/or to enable one substrate design to be used in two or more different combinations of semiconductor dice. In both of these further embodiments, the placement of conductive structures 60 may be changed, and some conductive structures 60, may be added or removed.

Figure 7:
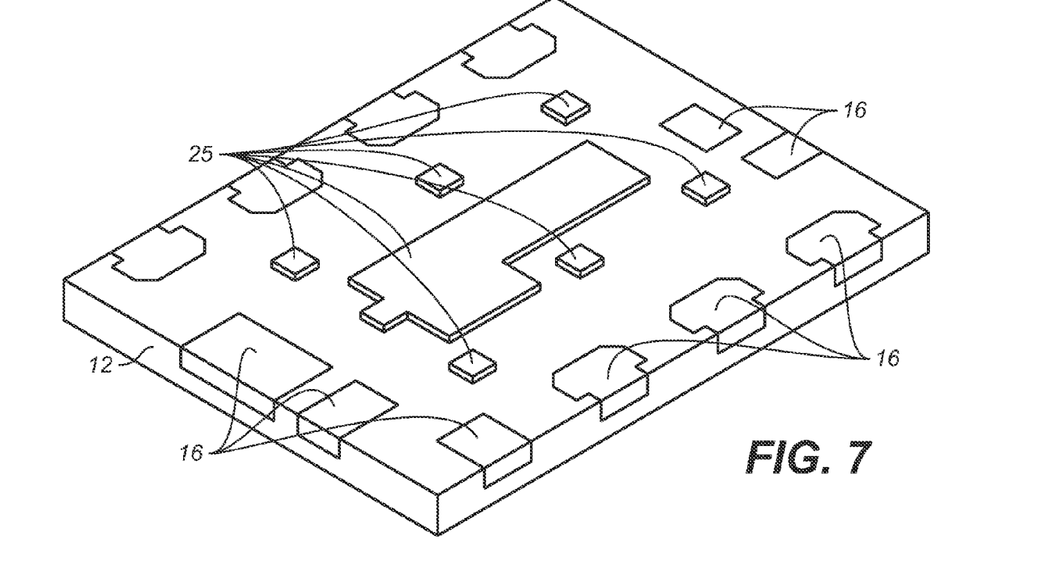
FIGS. 7-11 shows perspective views of the exemplary semiconductor die package during exemplary steps of a manufacturing embodiment according to the invention.
Figure 8:
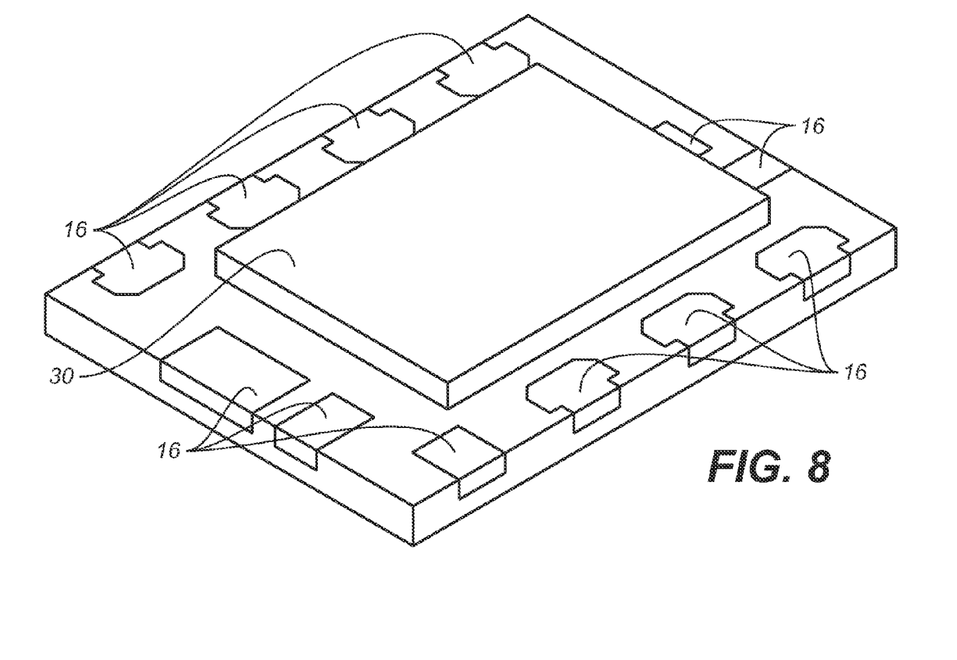

An exemplary manufacturing method embodiment of the invention is now described. FIGS. 7-11 shows perspective views of an exemplary semiconductor die package during exemplary steps of the method embodiment. Referring to FIG. 7, starting with a substrate 12, conductive material 25 is applied to conductive regions 15 of substrate 12, or to corresponding conductive regions on the front surface of a first semiconductor die 30, or to both sets of conductive regions. Conductive material 25 may comprise a conventional metal-based solder, and may be applied by several techniques, including screen printing of the solder in paste form, solder-ball attachment, pick-and-place processes, etc. Then, the front surface of die 30 is disposed to face substrate 12 in the area of regions 15, and the assembly is heated to cause conductive material 25 to bond conductive regions 15 to the conductive regions on the front surface of die 30. The resulting assembly is shown in FIG. 8. The latter step is conventionally called flip-chip bonding. When the conductive adhesive comprises a conventional metal-based solder, the heating of the assembly causes the conductive adhesive to reflow. The two general steps described in this paragraph collectively comprise attaching first semiconductor die 30 and substrate 12 together using conductive adhesive 25.

Figure 9:
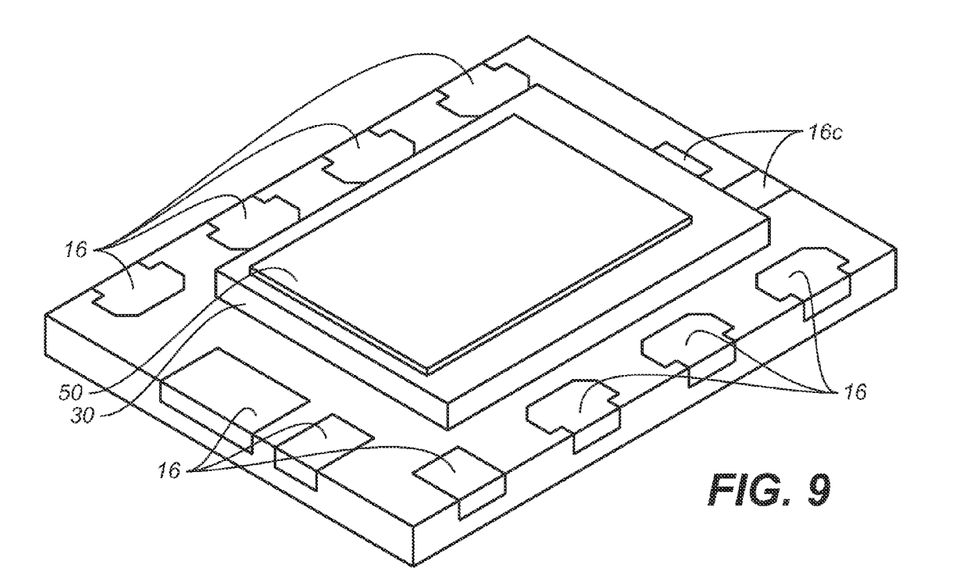
Figure 10:
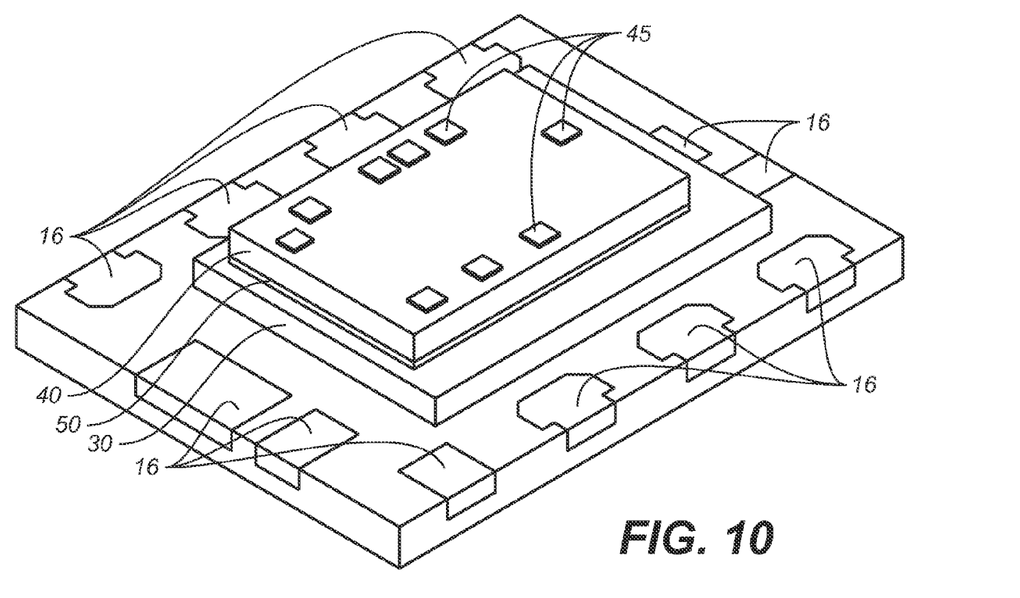

Referring to FIG. 9, an adhesive 50 is disposed on the back surface of first semiconductor die 30, which is the surface that is exposed in FIG. 9. Adhesive 50 may also be disposed on the back surface of second semiconductor die 40, or on both of these back surfaces. Adhesive 50 may comprise epoxy material, and may be initially in the form of a sheet, a body of material, or one or more drops of liquid or gel. Next, the back surface of second semiconductor die 40 is contacted to the back surface of first die 30, with adhesive 50 between the two back surfaces. If adhesive 50 requires heat to set or cure, then the assembly is heated to an elevated temperature above room temperature to set or cure adhesive 50. The resulting assembly is shown in FIG. 10. The two general steps described in this paragraph collectively comprise attaching second semiconductor die 40 and first semiconductor die 30 together, with the front surface of second semiconductor die 40 facing away from semiconductor die 30 and the back surface of die 40 facing die 30.

While the exemplary method embodiment has been illustrated by first attaching die 30 and substrate 12 together followed by attaching dice 30 and 40 together, it may be appreciated that these steps can be performed in the reverse order, or performed substantially simultaneously. In the former case, adhesive 50 may or may not have a transition temperature that is higher than any elevated temperature used to attached first semiconductor die 30 and substrate 12 together. In the latter case, substrate 12 and dice 30 and 40 may be stacked on top of one another, with adhesives 25 and 50 disposed between, and thereafter pressed together with the simultaneous application of heat to cause the adhesive materials to perform their bondings.

Figure 11:
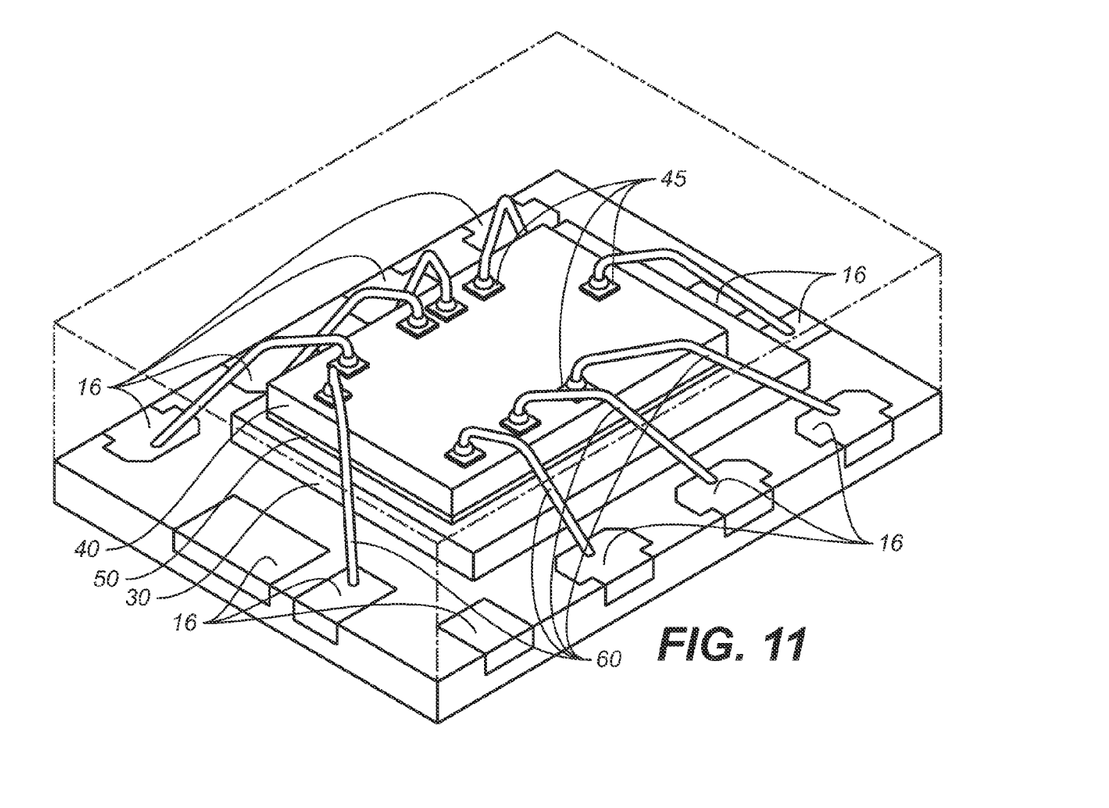

Referring to FIG. 11, the exemplary method embodiment further comprises attaching a plurality of conductive structures 60 between conductive regions 45 at the front surface 41 of second semiconductor die 40 and respective conductive regions 16 of substrate 12. Conductive structures 60 may comprise wire bonds, ribbon bonds, tape-automated bonds ("TAB bonds"), etc., and may be attached using any of the known attachment methods. This step, in general terms, attaches a plurality of conductive structures to the front surface of second semiconductor die 40 and the substrate 12. After conductive structures 60 are attached, the exemplary method may further comprise disposing a body 70 of electrically-insulating material over conductive structures 60 and the exposed surfaces of substrate 12 and semiconductor dice 30 and 40, to encapsulate conductive structures 60. The step may use injection molding techniques to provide a desired shape for package 10. The resulting package has a leadless configuration (i.e., no conductive leads extending substantially beyond the dimensions of the package), wherein electrical connections to it are made at the conductive regions 17 at second surface 14 of substrate 12.

In some implementations of semiconductor die package 10, first semiconductor die 30 may comprise one or more backside contacts near the periphery of the die's back surface 31. In this case, second semiconductor die 40 can be positioned relative to die 30 so that all or portions of the backside contacts are left exposed after the dice are attached. With this construction, conductive structures 60 may be attached between the backside contacts of die 30 and respective conductive regions 16 of substrate 12.

Figure 12:
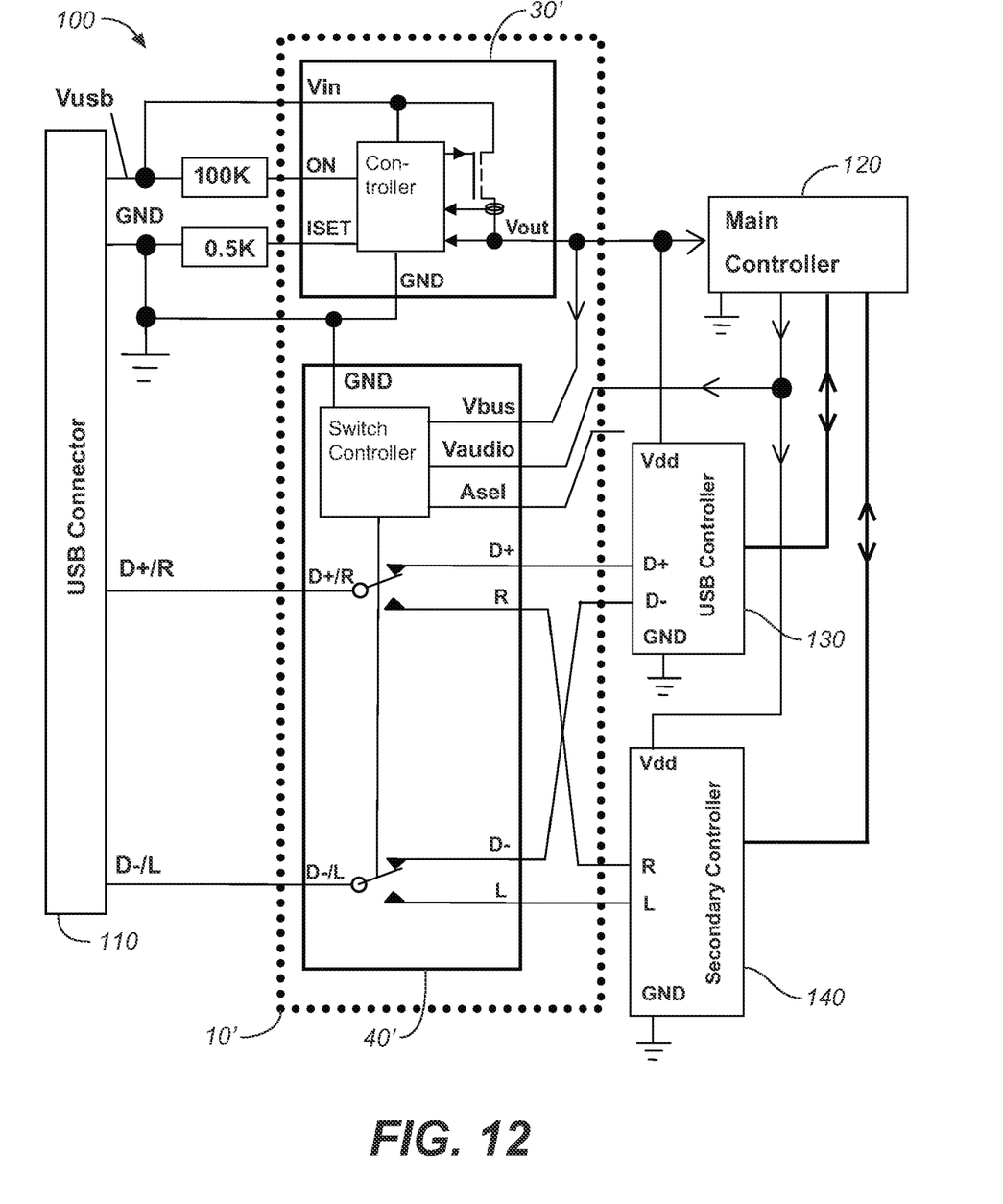
FIG. 12 shows a schematic diagram of an exemplary system using an exemplary semiconductor die according to the present invention.

A schematic diagram of a first exemplary system 100 using an exemplary semiconductor die package 10' according to the invention is shown in FIG. 12. System 100 comprises a main controller 120 that provides the overall services of system 100, a universal-serial-bus (USB) connector 110 that provides a communication connection to external devices, a USB controller 130 that provides an interface between main controller 120 and USB connector 110 and external devices connected thereto. USB connector 110 has four connection points as follows: a power connection to receive a power supply Vusb from a USB cable, a ground connection to receive a ground potential GND, a first data connection D+/R and a second data connection D−/L to receive data signals. System 100 further comprises a secondary controller 140 that generates and/or receives alternative signals that can be multiplexed onto the data connections D+/R and D−/L of USB connector 110, and a semiconductor die package 10' according to the invention that facilitates additional functionality for system 100 without a substantial increase in space requirements, as will be seen below.

System 100 is configured to transmit and/or receive the alternative signals associated with secondary controller 140 when a USB cable is not connected to USB connector 110, such as when an alternate cable is coupled to connector 110. In one implementation, system 100 can transmit and/or receive audio signals between secondary controller 140 when an audio cable is connected to USB connector 110, where such an audio cable may be coupled to a microphone, speaker, or other audio processing device. In this case, secondary controller 140 may comprise an audio coder/decoder (CODEC). The value of the potential difference between connections Vusb and GND of connector 110 may be used to determine whether a USB cable or an alternate cable is coupled to USB connector 110, or the frequency values of the signals present at the data connections D+/R and D−/L may be used for this determination. In the implementation illustrated in FIG. 12, the presence of a potential difference of approximately 3.5 volts or more is used to indicate the presence of a USB cable at connector 110, and the lack of a potential difference is used to indicate the presence of an audio cable or the lack of any cable. In addition, system 100 may be configured to be self-powered when a USB cable is not connected to USB connector 110, and may be further configured to obtain part or all of its power from a USB cable when such a cable is connected to its USB connector 110.

The above exemplary functionality is facilitated with a semiconductor die package 10' that has a power controller die 30' (e.g., power-control circuitry) as the first semiconductor die 30 and a signal multiplexer die 40' (e.g., signal-processing circuitry) as the second semiconductor die 40. Power controller die 30' detects the presence of a potential difference between connections Vusb and GND of connector 110, and from this generates a regulated source of voltage Vout, which in turn is used to power USB controller 130 (and optionally other components of system 100) and to indicate the presence of the USB cable to multiplexer die 40'. Die 30' comprises an input pad Vin to receive the bus supply voltage Vusb, a ground pad GND to receive the bus ground, a control pad ON to receive a start signal to start operation, an output supply pad Vout to provide a regulated power supply to USB controller 130 and other components of system 100 (optional), and a current-limit pad ISET to receive a signal indicating the value to which to limit the maximum output current provided at pad Vout. Control pad ON may be coupled to Vusb through a high-valued resistor, and current-limit pad ISET may be coupled to ground through a resistor. Additionally, die 30' comprises a power transistor having its two conduction terminals coupled to pads Vin and Vout, respectively, and its modulation terminal coupled to a controller. The power transistor is configured as a load transistor, which is a transistor that switches power to a load from a source, and may comprise a PMOS transistor. The controller receives signals from pads Vin, ON, ISET, and GND, and a further signal from a current sense device coupled to one of the conduction terminals of the power transistor. From these signals, the controller generates a control signal for the modulation terminal of the power transistor to cause the power transistor to regulate the power to pad Vout in the desired manner (e.g., limiting the maximum current provided at pad Vout to a value set by a resistor coupled between pad ISET and ground). Die 30' may comprise an IntelliMAX™ Advanced Load Management Product, model FPF2125, from Fairchild Semiconductor Corporation. The datasheet for the FPF2125 is hereby incorporated by reference.

Multiplexer die 40' comprises a double-pole double throw multiplexer that multiplexes data connections D+/R and D−/L of USB connector 110 between data signals D+ and D− from USB controller 130 on the one hand, and signals L and R from secondary controller 140 on the other hand. The selection of the multiplexer is controlled by a switch controller on die 40', which receives three inputs: Vbus, Vaudio, and Asel. When signal Vbus is active, the switch controller couples data connections D+/R and D−/L to data signals D+ and D−, respectively. When signal Vaudio is active and signal Asel is inactive, the switch controller couples data connections D+/R and D−/L to data signals R and L, respectively. When signal Vaudio is active while signal Asel is also active, the switch controller couples data connections D+/R and D−/L to data signals R and L, respectively (in this regard, Asel acts as an override input). When all the inputs signals are inactive, data connections D+/R and D−/L are decoupled from all of the signals D+, D−, R and L. Input Asel is biased to an inactive state, and for this reason may be left in a floating state, as shown in the figure. The switch controller comprises digital logic that receives these inputs and generates control signals to the components of the switches of the multiplexer. In the exemplary implementation of system 100, input Vbus is coupled to output Vout of semiconductor die 30', and input Vaudio is coupled to a signals from main controller 120. Thus, when die 30' detects the presence of a USB cable at connector 110, the multiplexer of die 40' couples the data connections D+/R and D−/L of connector 110 to the data signals D+ and D−, respectively, of USB controller 130. When a USB cable is not present, main controller 120 can direct the multiplexer of die 40' to couple the data connections D+/R and D−/L to the data signals R and L, respectively, of secondary controller 140 by activating signal Vaudio. Die 40' may comprise a USB2.0 High-Speed (480 Mbps) and Audio Switches with Negative Signal Capability Product, models FSA201 or FSA221, from Fairchild Semiconductor Corporation. The datasheet for the FSA201 and FSA221 are hereby incorporated by reference.

Of the two exemplary dice 30' and 40', die 30' generally generates the greater amount of heat (due to its regulation of power flow), and is advantageously placed next to substrate 12, where a portion of its surface can be attached to the large, center vertical conductor 22e (FIG. 6), which serves as both a vertical conductor and a thermally-conductive vertical path. Die 30' comprises both analog and digital circuitry, and die 40' also comprises both analog. In other exemplary systems, die 30' may predominantly comprise digital circuitry and die 40' may predominantly comprise analog circuitry, or vice versa.

The semiconductor die packages described above can be used in electrical assemblies including circuit boards with the packages mounted thereon. They may also be used in systems such as phones, computers, etc.

Some of the examples described above are directed to "leadless" type packages such as MLP-type packages (microleadframe packages) where the terminal ends of the leads do not extend past the lateral edges of the molding material. Embodiments of the invention may also include leaded packages where the leads extend past the lateral surfaces of the molding material.

Any recitation of "a", "an", and "the" is intended to mean one or more unless specifically indicated to the contrary.

The terms and expressions which have been employed herein are used as terms of description and not of limitation, and there is no intention in the use of such terms and expressions of excluding equivalents of the features shown and described, it being recognized that various modifications are possible within the scope of the invention claimed.

Moreover, one or more features of one or more embodiments of the invention may be combined with one or more features of other embodiments of the invention without departing from the scope of the invention.

While the present invention has been particularly described with respect to the illustrated embodiments, it will be appreciated that various alterations, modifications, adaptations, and equivalent arrangements may be made based on the present disclosure, and are intended to be within the scope of the invention and the appended claims.

What is claimed is:

1. A semiconductor die package comprising:
   a substrate comprising a premolded leadframe and having a first surface, a second surface, and a vertical conductor that spans between its first and second surfaces;
   a first semiconductor die;
   a conductive adhesive disposed between the first semiconductor die and the first surface of the substrate, wherein the vertical conductor is coupled to at least one region of the first semiconductor die by at least a portion of said conductive adhesive;
   a second semiconductor die located on the first semiconductor die, the second semiconductor die comprising a first surface facing away from the first semiconductor die and a second surface facing toward the first semiconductor die; and
   a plurality of conductive structures electrically coupling conductive regions at the first surface of the second semiconductor die to conductive regions at the first surface of the substrate.

2. The semiconductor die package of claim 1 wherein the conductive structures comprise wires and wherein the conductive adhesive comprises solder.

3. The semiconductor die package of claim 1 wherein the substrate further comprises a first plurality of conductive regions disposed at its first surface and electrically coupled to conductive regions of the first semiconductor die by portions of said conductive adhesive, a second plurality of conductive regions disposed at the substrate's first surface, and an electrical trace that electrically couples at least one of said first conductive regions to at least one of said second conductive regions; and
   wherein at least one said conductive structure is attached to a second conductive region that is electrically coupled to said trace.

4. The semiconductor die package of claim 3 wherein the substrate further comprises a third plurality of conductive regions disposed at its second surface, and wherein the electrical trace is further electrically coupled to at least one of said third plurality of conductive regions.

5. The semiconductor die package of claim 1 further comprising a molding material covering at least a portion of the first semiconductor die and the second semiconductor die.

6. The semiconductor die package of claim 1 wherein the semiconductor die package has a leadless configuration.

7. The semiconductor die package of claim 1 further comprising an insulating layer between the first semiconductor die and the second semiconductor die.

8. The semiconductor die package of claim 1 wherein the first semiconductor die comprises at least one load switch, and wherein second semiconductor die comprises a double-pole double throw multiplexer.

9. The semiconductor die package of claim 1 wherein the first semiconductor die comprises a power transistor, and wherein the second semiconductor die comprises at least one control circuit.

10. The semiconductor die package of claim 1 wherein the first semiconductor die comprises power-control circuitry, and wherein the second semiconductor die comprises signal-processing circuitry.

11. A system comprising a USB controller and the semiconductor die package of claim 1 coupled to the USB controller.

12. A method comprising:
    attaching a first semiconductor die and a substrate together using a conductive adhesive, the substrate comprising a premolded leadframe;
    attaching the first semiconductor die and a second semiconductor die together using an adhesive, wherein the second semiconductor die has a first surface facing away from the first semiconductor die and a second surface facing toward the first semiconductor die; and
    attaching a plurality of conductive structures to the first surface of the second semiconductor die and the substrate, and
    wherein the first and second semiconductor dice are attached together before the first semiconductor die and the substrate are attached together.

13. The method of claim 12 wherein attaching the first semiconductor die and the substrate together comprises applying conductive material to at least a plurality of conductive regions of the substrate.

14. The method of claim 12 wherein attaching the first semiconductor die and the substrate together comprises applying conductive material to at least a plurality of conductive regions of the first semiconductor die.

15. The method of claim 12 wherein attaching the first semiconductor die and the substrate together comprises applying a solder paste to a plurality of conductive regions, the conductive regions being located on one or both of the substrate and the first semiconductor die, and thereafter contacting the first semiconductor die and substrate together and applying heat.

16. The method of claim 12 wherein attaching the first and second semiconductor dice together comprises disposing an adhesive on the first semiconductor die.

17. The method of claim 12 wherein attaching the first and second semiconductor dice together comprises attaching the inactive surfaces of the first and second semiconductor dice together.

18. The method of claim 12 wherein attaching a plurality of conductive structures to the first surface of the second semiconductor die and the substrate comprises attaching a wire bond between a conductive region on the substrate and a conductive region on the first surface of the second semiconductor die.

19. The method of claim 12 wherein the first semiconductor die and the substrate are attached together before the first and second semiconductor dice are attached together.

20. The method of claim 12 further comprising disposing a body of electrically-insulating material over the conductive structures and the exposed surfaces of the substrate and semiconductor dice.

21. A semiconductor die package comprising:
a substrate comprising having a first surface and a second surface;
a first semiconductor die;
a conductive adhesive disposed between the first semiconductor die and the first surface of the substrate;
a second semiconductor die located on the first semiconductor die, the second semiconductor die comprising a first surface facing away from the first semiconductor die and a second surface facing toward the first semiconductor die; and
a plurality of conductive structures electrically coupling conductive regions at the first surface of the second semiconductor die to conductive regions at the first surface of the substrate; and
wherein the substrate further comprises a first plurality of conductive regions disposed at its first surface and electrically coupled to conductive regions of the first semiconductor die by portions of said conductive adhesive, a second plurality of conductive regions disposed at the substrate's first surface, and an electrical trace that electrically couples at least one of said first conductive regions to at least one of said second conductive regions; and
wherein at least one said conductive structure is attached to a second conductive region that is electrically coupled to said trace.

22. The semiconductor die package of claim 21 wherein the substrate further comprises a third plurality of conductive regions disposed at its second surface, and wherein the electrical trace is further electrically coupled to at least one of said third plurality of conductive regions.

23. A semiconductor die package comprising:
a substrate comprising a premolded leadframe and having a first surface and a second surface;
a first semiconductor die comprising a power transistor;
a conductive adhesive disposed between the first semiconductor die and the first surface of the substrate;
a second semiconductor die located on the first semiconductor die, the second semiconductor die comprising a first surface facing away from the first semiconductor die, a second surface facing toward the first semiconductor die, and at least one control circuit; and
a plurality of conductive structures electrically coupling conductive regions at the first surface of the second semiconductor die to conductive regions at the first surface of the substrate.

24. The semiconductor die package of claim 23 wherein the conductive structures comprise wires and wherein the conductive adhesive comprises solder.

25. The semiconductor die package of claim 23 further comprising a molding material covering at least a portion of the first semiconductor die and the second semiconductor die.

26. A method comprising:
attaching a first semiconductor die and a substrate together using a conductive adhesive, the substrate comprising a premolded leadframe, wherein attaching the first semiconductor die and the substrate together comprises applying conductive material to at least a plurality of conductive regions of the substrate;
attaching the first semiconductor die and a second semiconductor die together using an adhesive, wherein the second semiconductor die has a first surface facing away from the first semiconductor die and a second surface facing toward the first semiconductor die; and
attaching a plurality of conductive structures to the first surface of the second semiconductor die and the substrate.

27. The method of claim 26 wherein attaching the first and second semiconductor dice together comprises attaching the inactive surfaces of the first and second semiconductor dice together.

28. The method of claim 26 wherein attaching a plurality of conductive structures to the first surface of the second semiconductor die and the substrate comprises attaching a wire bond between a conductive region on the substrate and a conductive region on the first surface of the second semiconductor die.

* * * * *